(12) United States Patent
Jalali et al.

(10) Patent No.: US 12,119,669 B1
(45) Date of Patent: Oct. 15, 2024

(54) METHOD AND/OR SYSTEM FOR CONVERSION OF LASER ENERGY TO ELECTRICAL ENERGY

(71) Applicant: WIRELESS PHOTONICS, LLC, El Segundo, CA (US)

(72) Inventors: Bahram Jalali, Los Angeles, CA (US); William R Ryan, Los Angeles, CA (US); Ahmadreza Rofougaran, Newport Coast, CA (US)

(73) Assignee: Wireless Photonics, LLC, El Segundo, CA (US)

( * ) Notice: Subject to any disclaimer, the term of this patent is extended or adjusted under 35 U.S.C. 154(b) by 0 days.

(21) Appl. No.: 18/395,591

(22) Filed: Dec. 24, 2023

(51) Int. Cl.
| | |
|---|---|
| *H02J 50/30* | (2016.01) |
| *H01L 31/02* | (2006.01) |
| *H01L 31/052* | (2014.01) |
| *H01L 31/053* | (2014.01) |
| *H02J 50/80* | (2016.01) |

(52) U.S. Cl.
CPC ........ *H02J 50/30* (2016.02); *H01L 31/02021* (2013.01); *H01L 31/052* (2013.01); *H01L 31/053* (2014.12); *H02J 50/80* (2016.02)

(58) Field of Classification Search
CPC ......... H02J 50/30; H02J 50/80; H01L 31/052; H01L 31/053; H01L 31/02021; H04B 10/11; H04B 10/25; H04B 10/503; H04B 10/572
See application file for complete search history.

(56) References Cited

U.S. PATENT DOCUMENTS

| | | |
|---|---|---|
| 4,324,946 A | 4/1982 | Gravisse |
| 6,476,312 B1 | 11/2002 | Barnham |
| 8,774,573 B2 | 7/2014 | Kenney et al. |
| 2008/0223448 A1 | 9/2008 | Xiang et al. |
| 2010/0236625 A1 | 9/2010 | Kenney et al. |
| 2016/0087400 A1* | 3/2016 | Zhu .................... H04B 10/0779 372/38.02 |

OTHER PUBLICATIONS

Algora, C., et al., Beaming power: Photovoltaic laser power converters for power-by-light. Joule Joule, 6(2), 340-368 (2022).
Cox, J. A., et al., Control of integrated micro-resonator wavelength via balanced homodyne locking. Optics express, 22(9), 11279-11289 (2014).

(Continued)

*Primary Examiner* — Kevin K Pyo

(57) ABSTRACT

Described herein is a system to convert laser light to electrical energy which exploits a narrow band nature of laser light, and a cavity resonance effect in order to increase an absorption of the laser light and thus, an efficiency in conversion of the laser light to electrical energy. For the resonant effect to take place in the photovoltaic cells, the laser wavelength emitted by the laser should match at least one of the resonant lines of the resonant cavity. A resonant cavity enhances an intensity of laser light inside the photovoltaic cell. The subject matter lowers a cost of the photovoltaic cell by making it possible to use a thinner (and more mechanically flexible) semiconductor for the photovoltaic cell while achieving the good laser light to power conversion efficiency.

19 Claims, 9 Drawing Sheets

(56) References Cited

OTHER PUBLICATIONS

Chen, H.L., et al., A 19.9%-efficient ultrathin solar cell based on a 205-nm-thick GaAs absorber and a silver nanostructured back mirror. Nature Energy, 4(9), 761-767 (2019).
Helmers, H et al. 68.9% efficient GaAs-based photonic power conversion enabled by photon recycling and optical resonance. (RRL)—Rapid Research Letters, 15(7), 2100113.
Fathpour, S., Tsia, K. K., & Jalali, B., Two-photon photovoltaic effect in silicon. IEEE Journal of quantum electronics, 43(12), 1211-1217 (2007).
Murtaza, S. S., Short-wavelength, high-speed, Si-based resonant-cavity photodetector. IEEE Photonics Technology Letters, 8(7), 927-929 (1996).

* cited by examiner

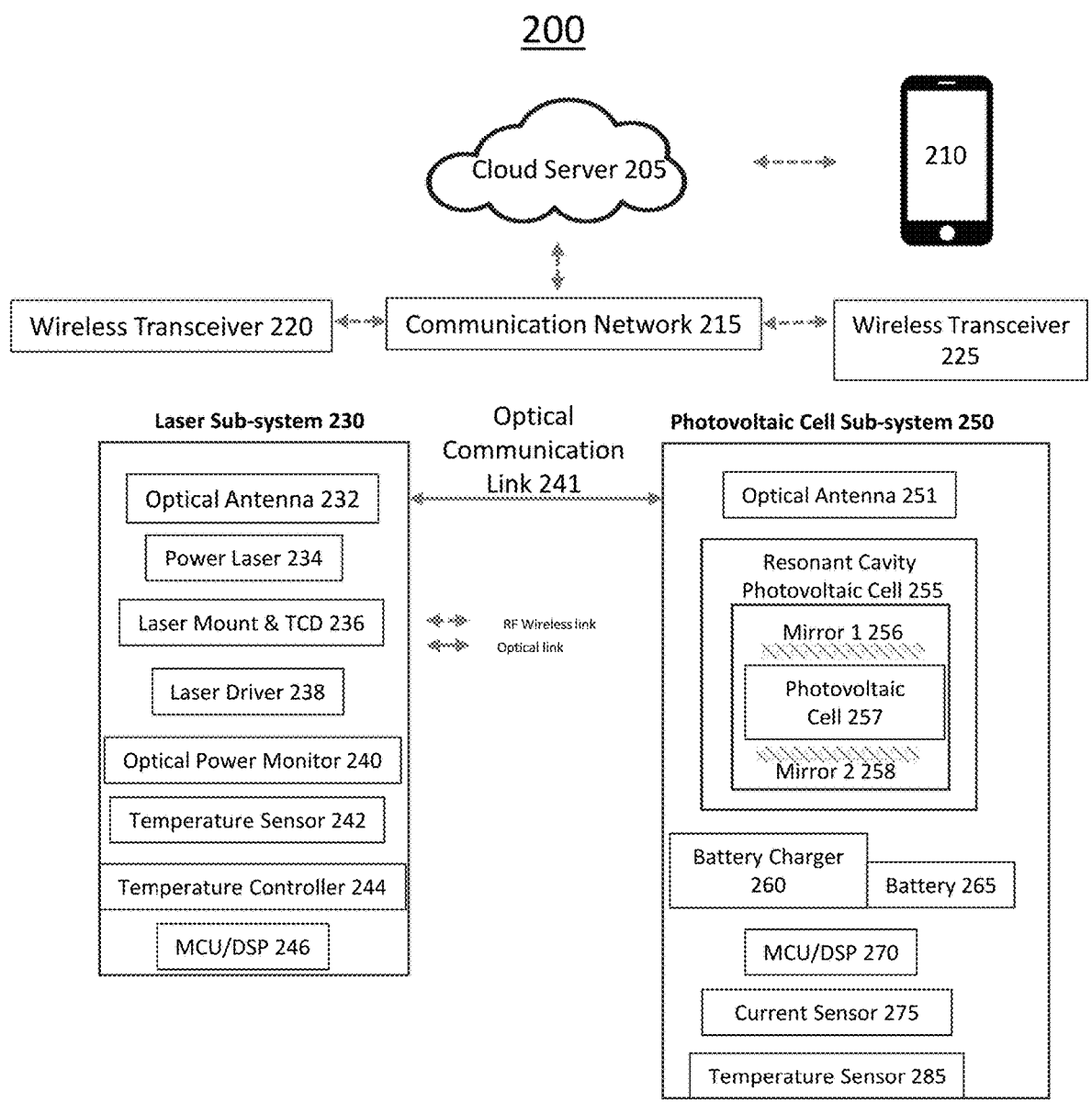

400

Embodiment utilizing current sensing at receiver and tunable laser at transmitter and wireless communication Embodiment utilizing current sensing at receiver and tunable laser at transmitter and wireless communication Resonant Cavity Photovoltaic Device
FIG. 6A
Fabry-Perot Resonator Embodiment
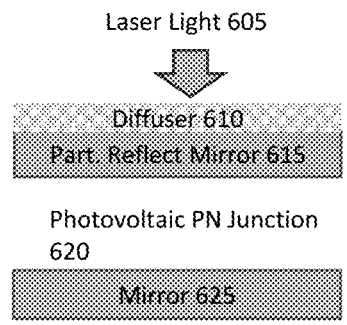
Photovoltaic PN Junction 620
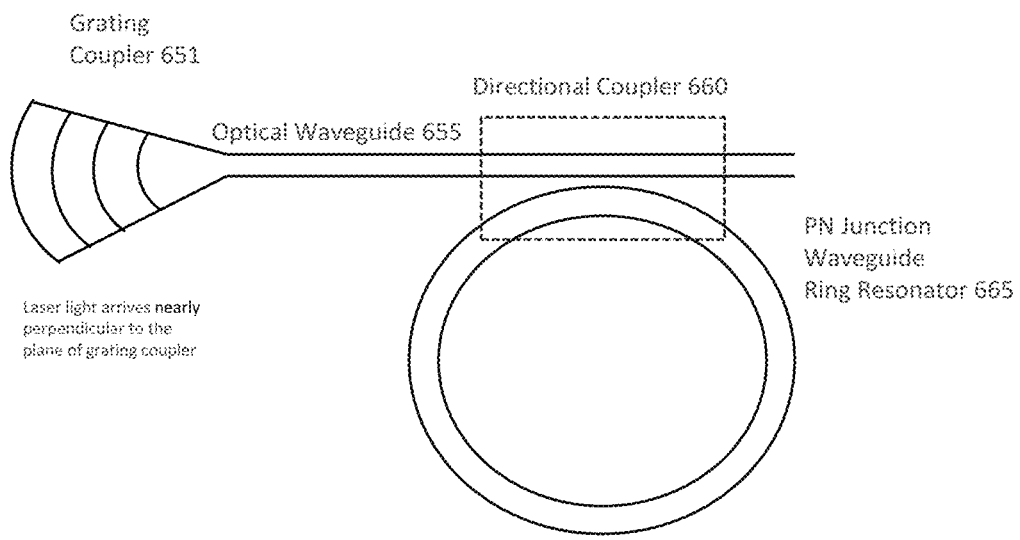
FIG. 6B Passively cooled laser mount 700

METHOD AND/OR SYSTEM FOR CONVERSION OF LASER ENERGY TO ELECTRICAL ENERGY

CROSS-REFERENCE TO RELATED APPLICATIONS/INCORPORATION BY REFERENCE

None.

FIELD OF TECHNOLOGY

The field of the technology described herein is related to systems and methods of utilizing resonant cavity photovoltaic cells to convert laser energy to electrical energy with optional network connectivity for optimization of the energy conversion.

BACKGROUND

Photovoltaic solar cells, commonly known as solar cells, are devices that convert sunlight directly into electricity through a process known as the photovoltaic effect. This process takes advantage of the properties of semiconductors to generate an electric current when exposed to light. This conversion process consists of (1) absorption of light in the semiconductor resulting in generation of electrons and holes each carrying a negative and positive charge respectfully, (2) separation of charges by the internal electric field of the PN junction diode resulting in an electric current flow, and (3) flow of the current through an external load connected to the diode. The basic operation is partly similar to a photodiode acting as a photo detector, as they both convert light to electrical current using a PN junction diode. However, the energy generation property of a photovoltaic solar cell stems from a very different operating condition. Photodiodes operate in the 3rd quadrant of the diode current-voltage (I-V) regime where the power consumption, given by the mathematical "product" of current (negative) and voltage (negative) is positive. In contrast, photovoltaic solar cells operate in the 4th quadrant where the mathematical "product" of the current (negative) and voltage (positive) is negative. The negative power dissipated is the positive power generated by the solar cell. The electrical current produced by the photovoltaic solar cell is DC (direct current) which can be converted to AC (alternating current) using an inverter. The efficiency of photovoltaic solar cells is limited by the amount of light that gets absorbed, and the percentage of electron-hole pairs that are collected vs. the electron-hole pairs that recombine and thus are annihilated before collection. In the case of sunlight, a significant portion of the solar spectrum is outside the absorption band of the semiconductor used in the photovoltaic solar cell. The theoretical maximum efficiency for a single-junction diode is given by the Shockley-Queisser limit and is about 33% for silicon.

Spectral Loss: For optical to electrical power conversion to occur, the light must be absorbed in the semiconductor. The requires the photon energy, $E=h\nu=hc/\lambda$, to be larger than the bandgap energy of the semiconductor, $E_g$. Here h is the Planck constant, v is the frequency and $\lambda$ is the wavelength of light's electromagnetic radiation. For silicon, the bandgap energy of 1.1 eV corresponds to a wavelength of approximately 900 nm. This longer wavelength portion of the sun spectrum does not get absorbed in silicon and hence is not converted to electrical energy. At the same time, a significant portion of the sun's radiation consists of photons with higher energy than the bandgap energy. This leads to generation of electron-hole pairs with excess energy, which is converted to heat through scattering by phonons. The absorption coefficient for these high energy photons is too high causing them to be absorbed too close to the surface where photogenerated carriers do not get collected. The so called "spectral loss" leads to rise in device temperature causing a reduction in the efficiency of the optical to electrical conversion. On the other hand, when the light source is a laser, which has a narrow band emission spectrum, the wavelength of the laser can be chosen to be near the band edge causing high absorption while avoiding this source of heat generation.

Photovoltaic technology can also be applied to conversion of laser light to electrical power. Photovoltaic laser power converters (PVLPCs) serve as the central component in power-by-light (PBL) systems, comprising a power laser, optical fiber, and PVLPC. Optical Wireless Power Transmission (OWPT) refers to the same system except the optical fiber is replaced by propagation of the laser light in free space. PBL and OWPT enable the secure transmission of power in scenarios where utilizing electrical energy directly to operate electronic devices is impractical or ill-advised. The inception of the initial PBL system dates back to 1978, but it is only in recent times that PBL systems have witnessed a surge in popularity, driven by ongoing enhancements in efficiency. Laser power delivery, such as described herein by this new and unique process and system, represent an attractive approach to monitoring and regulating processes within environments characterized by stringent safety requirements, such as those prone to fire or explosion hazards (such as refineries, mines, fuel tanks in space, and/or aircraft) or those necessitating electrical isolation including high-voltage power lines, lightning-resistant monitoring, and/or medical applications.

BRIEF SUMMARY OF THE DISCLOSURE

Described herein is a breakthrough solution to address the above-described issues. Current photovoltaic cells are optimized for sunlight which has a broad spectrum. In contrast, lasers have a narrow spectrum. The subject matter described herein exploits a narrow band nature of laser light, and a cavity resonance effect in order to increase an absorption of the laser light and thus, an efficiency in conversion of the laser light to electrical energy. In exemplary embodiments, for the resonant effect to take place in the photovoltaic cells, the laser wavelength emitted by the laser should match at least one of the resonant lines of the resonant cavity. In exemplary embodiments, a resonant cavity enhances an intensity of laser light inside the photovoltaic cell. In these embodiments, this property can be exploited to increase the efficiency of light absorption from the laser light into the photovoltaic cell and a conversion efficiency of a photovoltaic cell in converting the laser light into electrical energy. Another utility of the subject matter described herein is to lower a cost of the photovoltaic cell by making it possible to use a thinner semiconductor for the photovoltaic cell while achieving the good laser light to power conversion efficiency described herein. In exemplary embodiments, a thinner device may also be more mechanically flexible.

These and other advantages, aspects and novel features of the present disclosure, as well as details of an illustrated embodiment thereof, will be more fully understood from the following description and drawings. For example, the distributed nature of the subject matter described herein also overcomes the problems caused by saturation of the photodetector or photovoltaic cell device at high optical powers which are needed to achieve high dynamic range and high signal to noise ratio in electrooptic links.

BRIEF DESCRIPTION OF DRAWINGS

FIG. 2 illustrates a system for converting laser energy into electrical energy including a laser subsystem or laser device and a representative resonant cavity photovoltaic device according to exemplary embodiments.

FIG. 6A illustrates a Fabry-Perot resonator embodiment of a resonant cavity photovoltaic device according to some embodiments.

FIG. 6B illustrates a ring resonator embodiment of a resonant cavity photovoltaic device according to exemplary embodiments.

DETAILED DESCRIPTION OF THE DISCLOSURE

Figure 1:
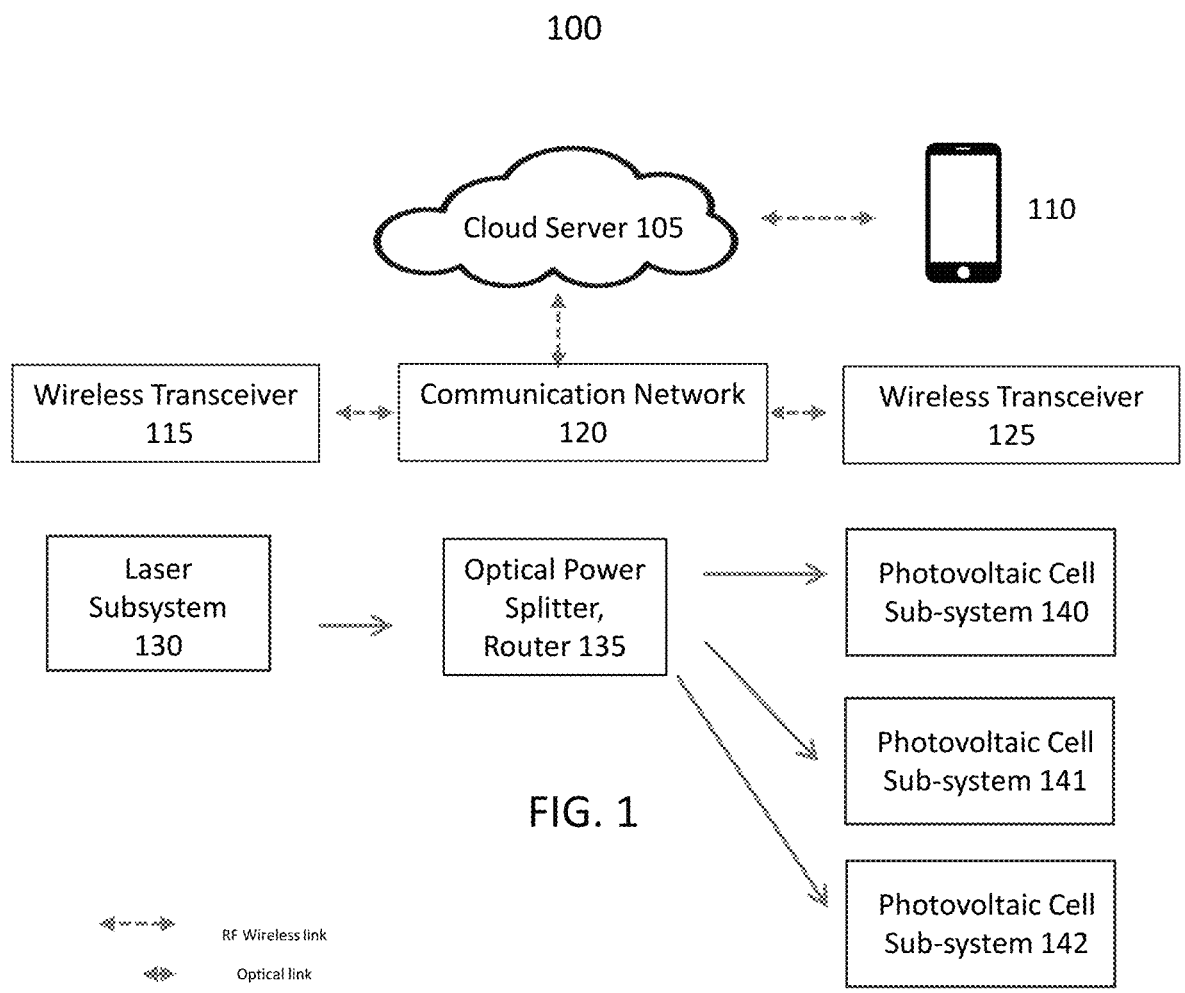
FIG. 1 illustrates a system for converting laser energy into electrical energy according to exemplary embodiments.

The following detailed description provides a better understanding of the features and advantages of the inventions described in the present disclosure in accordance with the embodiments disclosed herein. Several physical implementations of this idea are presented.

In the following description, reference is made to the accompanying drawings, which form a part hereof, and in which is shown, by way of illustration, various embodiments of the present disclosure.

Described herein is a resonant cavity photovoltaic cell with digital communication control features to convert laser light into electrical energy, such as direct current (DC). In exemplary embodiments, the resonant cavity photovoltaic cell may be a Fabry-Perot type resonator with normal incident laser light. In exemplary embodiments, the resonant cavity photovoltaic cell may be a semiconductor PN junction waveguide ring resonator with grating couplers to input normal incidence light into a waveguide.

In addition, the increased absorption realized may allow the resonant cavity photovoltaic devices to be made utilizing very thin films. An example of an application for thin film photovoltaic cell devices are microfliers. In some implementations, microfliers may refer to small robotic devices that can change shape in midair to control their descent. In exemplary embodiments, the microfliers may be powered by an array of lightweight thin-film solar resonant cavity photovoltaic devices that eliminate the need for heavy, bulky batteries.

Analysis of the Efficiency: Assuming the resonant cavity photovoltaic cell resonator is a Fabry-Perot type with mirror defectivities $R_1$ and $R_2$, a peak value of efficiency at resonant wavelength is:

$$Eff = (1 - R_1)(1 - e^{\alpha d})\left[\frac{1 + R_2 e^{-\alpha d}}{\left(1 - \sqrt{R_1 R_2}\, e^{-\alpha d}\right)^2}\right]$$

In the equation described above, $\alpha$ is the absorption coefficient, d is the length of the absorption region, and $R_1$ and $R_2$ are the reflectivity of the two mirrors. As an example, for $R_2=0.99$, $R_2=0.2$, $\alpha=10^4$ cm$^{-1}$, $d=0.7$ μm, a light absorption efficiency of 99% can be achieved.

In exemplary embodiments, resonators (such as resonant cavity photovoltaic cell described herein) are susceptible to changes in temperature as well as variation of the resonator dimensions, and hence resonant frequency variations, due to manufacturing errors. In exemplary embodiments, this susceptibility may be managed and/or handled via thermal stabilization using one or more integrated temperature sensors and one or more heater elements to keep the resonant cavity photovoltaic cell temperature within an acceptable range via a feedback control device or apparatus. In exemplary embodiments, a "wavelength locking" approach may ensure that an operating frequency or wavelength of the resonator (resonant cavity photovoltaic device) and the frequency or wavelength of the power laser match.

In exemplary embodiments, another approach for overcoming the thermal sensitivity of the resonant cavity photovoltaic device may be achieved with the use of a second material of opposite thermal coefficient inside or within the resonant cavity of the resonant cavity photovoltaic device.

In exemplary embodiments, another solution to overcome the thermal sensitivity of the resonant cavity photovoltaic device may be to monitor the generated electrical current, and to maximize it, via thermal tuning or adjustment of cavity length or cavity wavelength. In another exemplary embodiment, yet another solution for overcoming the thermal sensitivity of the resonant cavity photovoltaic device is homodyne detection of a frequency drift using an interferometer, which generates an error signal for feedback control of the resonant cavity photovoltaic device.

In exemplary embodiments, a further solution to overcome the thermal sensitivity of the resonant cavity photovoltaic device may be to tune or adjust a frequency or wavelength of the power laser transmitter. Hence, in exemplary embodiments, the subject matter described herein may include an optional wireless or optical communication link between the power laser and the resonant cavity photovoltaic cell device. In this exemplary embodiment, the communication link is used to tune a power laser frequency to stay locked to the resonance wavelength of the resonant cavity photovoltaic device.

In exemplary embodiments, a required precision of frequency control may be governed by physics of the resonant cavity photovoltaic device and may be quantified by a bandwidth of the photovoltaic device resonance. In exemplary embodiments, a narrow bandwidth may lead to stronger enhancement but may require more precise control of the resonant cavity photovoltaic frequency or wavelength or a power laser frequency or wavelength. In exemplary embodiments, a useful parameter is a resonant cavity photovoltaic device's "Finesse" which may be a ratio of the bandwidth, (as measured by the full-width-half-max (FWHM)), to the free spectral range (FSR), (which is the spacing of the resonant lines). As an illustrative example, for a resonant cavity with internal absorption, as in the resonant photovoltaic device, the Finesse may be given by:

$$F = \frac{FSR}{FWHM} = \frac{\pi(R_1 R_2)^{\frac{1}{4}} \exp\left(-\frac{\alpha d}{2}\right)}{\left(1 - \sqrt{R_1 R_2} \exp(-\alpha d)\right)^2}$$

On the other hand, the FSR in terms of wavelength may be given by:

$$FSR = \frac{\lambda^2}{2nd}$$

Where n is the refractive index inside the cavity and $\lambda$ is the wavelength, and $\nu$ is the optical frequency.

In exemplary embodiments, different materials may be utilized for the power laser device and/or the resonant cavity photovoltaic device. In some implementations, silicon is the most common material and may convert light with frequencies or wavelengths up to approximately 1000 nm (nanometers). For other frequencies or wavelengths, compound semiconductors such as CdTe, GaAs or InP based compounds may be utilized. In other implementations, the power laser device and/or the resonant cavity photovoltaic device may be made utilizing other options include Copper indium gallium selenide (CIGS), Perovskites, and Dye-sensitized Solar Cells (DSCs).

In exemplary embodiments, cavity enhancement of the light intensity inside the subject resonant cavity photovoltaic device may offer an exciting possibility of converting infrared (IR) light into electrical energy. In embodiments, a photon energy of infrared (IR) light may be below a bandgap of common semiconductors (such as silicon), and therefore the IR light does not get absorbed. However, at high optical intensities, multiphoton absorption occurs converting the IR light into useful electrical energy. Due to its nonlinear nature, two-photon absorption only occurs at high optical intensities that are not reached in normal photovoltaic devices. However, the resonant enhancement of intensity enabled by the design and frequency locking of the resonant cavity photovoltaic device of the claimed subject matter may help to induce multiphoton absorption. This requires that a resonant cavity photovoltaic device have a high cavity design with very high Finesse.

FIG. 1 illustrates a system for delivering and converting laser energy into electrical energy according to exemplary embodiments. In exemplary embodiments, the conversion system 100 may include a cloud server computing device 105, a mobile communications device 110, a first wireless communication transceiver 115, a communication network 120, a second wireless communication transceiver 125, a laser subsystem 130, an optical power splitter or router 135, and a plurality of resonant cavity photovoltaic devices 140, 141, and/or 142. In some implementations, the laser subsystem 130 may be referred to as a transmitting node and the plurality of resonant cavity photovoltaic devices 140, 141 and/or 142 may be referred to as receiving nodes. In some implementations, the transmitting nodes (e.g., a laser subsystem) and the receiving nodes may be Internet of Thing nodes connected by a low power wireless communication protocol such as Thread and Matter. In some implementations, there may be large numbers of resonant cavity photovoltaic devices (thousands, tens of thousands, hundreds of thousands) while in other applications, there may be few numbers (e.g., single digits, ten or more or hundreds of photovoltaic devices).

In exemplary embodiments, the laser subsystem 130 may include one or more power laser devices, where each of the one or more power laser devices may communicate a plurality of laser light beams. In exemplary embodiments, the laser subsystem 130 may be communicatively coupled to an optical power splitter or router 135. In some implementations, the laser subsystem 130 may be transmitting power in power-by-light (PBL) systems of Optical Wireless Power Transmission (OWPT) systems.

In exemplary embodiments, the one or more laser light beams may be transmitted to a plurality of optical power to electrical power conversion devices. In exemplary embodiments, the optical power splitter or router 135 may receive the plurality of laser light beams from the laser subsystem 130. In exemplary embodiments, the optical power splitter or router 135 may be communicatively or optically coupled to the plurality of resonant cavity photovoltaic devices or subsystems 140, 141 and 142. In some implementations, the plurality of laser light beams may be transmitted by an optical fiber and in other implementations, the plurality of power laser light beams may be transmitted via free space optical links. In some implementations, each of the resonant cavity photovoltaic devices 140, 141, and 142 may receive a plurality of laser light beams from the optical power splitter or router 135. In exemplary embodiments, the resonant cavity photovoltaic devices 140, 141 and 142 may convert the plurality of laser light beams into electrical energy or power. In order to maximize electrical optical power generation, a laser subsystem 130 frequency or wavelength should match an operating frequency of the one or more resonant cavity photovoltaic devices 140, 141, and 142.

In exemplary embodiments, the laser subsystem 130 may need to communicate control signals, data signals and/or messages to one or more of the plurality of resonant cavity photovoltaic devices 140 in addition to the laser power signals. In some implementations, this communication may occur over a wireless communication network 120. In exemplary embodiments, a first wireless communication transceiver 115 may be communicatively coupled to the laser subsystem 130. In exemplary embodiments, a second wireless communication transceiver 125 may be communicatively coupled to the one or more of the plurality of the resonant cavity photovoltaic devices 140 141 and 142. In exemplary embodiments, the first wireless communication transceiver 115 may be communicatively coupled to the second wireless communication transceiver 125 via the communication network 120, which may be a wireless communication network. In exemplary embodiments, sensor signals, messages, commands and/or control signals may be transmitted to or from laser subsystem 130 to the first wireless communication transceiver 115 and then to the second wireless communication transceiver 125 over the wireless communication network 120 and finally to one or more of the plurality of resonant cavity photovoltaic devices or subsystem 140, 141 and 142. In some implementations, the wireless communication network 120 may be operated according to a radio frequency network protocol. In some implementations, the laser and the photovoltaic devices may be nodes on an Internet of Things (IoT) network and communicate via a Thread mesh network and may by compatible with the Matter protocol for interoperability. In exemplary embodiments, a user may want to monitor operation of the system 100 to convert laser energy to electrical energy. In these implementations, monitoring and/or data logging of the one or more power laser devices or subsystems 130 and/or the one or more resonant cavity photovoltaic devices or subsystem 140, 141 and 142 may be performed by software or computer-readable instructions executing on the cloud server computing device 105.

In exemplary embodiments, a mobile communications device 110 may be communicatively coupled to a cloud server computing device 105. In exemplary embodiments, the mobile communications device 110 may communicate with the cloud server computing device in order to communicate instructions and/or to receive data and/or parameters from the system to convert laser energy into electrical energy. In exemplary embodiments, the cloud server computing device 105 may be communicatively coupled to the laser subsystem 130 and one or more of the plurality of resonant cavity photovoltaic devices 140, 141, 142 via the wireless communication network 120, the first wireless communication transceiver 115 and the second wireless communication transceiver 125. This allows the wireless communication device 110 to monitor and/or communicate with the laser subsystem 130 and/or the plurality of resonant cavity photovoltaic devices 140, 141 and 142.

In exemplary embodiments, the plurality of photovoltaic devices may be an array of resonant cavity photovoltaic devices. In exemplary embodiments, the array of resonant cavity photovoltaic devices may be on a single physical device, such as a substrate. In some implementations, each of the array of resonant cavity photovoltaic devices may be a thin film resonant cavity photovoltaic device. In exemplary embodiments, each of the array of resonant cavity photovoltaic devices may correspond to pixels in an image array. In exemplary embodiments, the array of resonant cavity photovoltaic devices may be utilized in a high bandwidth and/or high-power application.

In exemplary embodiments, an optical fiber may be a multicore optical fiber. In other words, the optical fiber may include a plurality of optical fiber cores. In exemplary embodiments, the multicore optical fiber allows for a large amount of data to be transmitted. Again, a multicore optical fiber can be used in high bandwidth and thus high power applications. In exemplary embodiments, an array of resonant cavity photovoltaic cells may be utilized with a multicore optical fiber. In these implementations, each resonant cavity photovoltaic cell (and representative or associated pixel) may be aligned with one of the cores in the multicore optical fiber. In these implementations, the array of resonant cavity photovoltaic cells that are aligned with associated cores in the multifiber core may be utilized in high power applications.

FIG. 2 illustrates a block diagram of a system for converting laser energy into electrical energy including a power laser subsystem or laser device and a representative resonant cavity photovoltaic subsystem according to exemplary embodiments. In exemplary embodiments, the system 200 may include a mobile communication device 210, a cloud server computing device 205, a communication network 215, a first wireless communication transceiver 220, a second wireless communication transceiver 225, a laser subsystem or laser device 230, an optical communication link 241, and a resonant cavity photovoltaic device or subsystem 250.

Figure 3A:
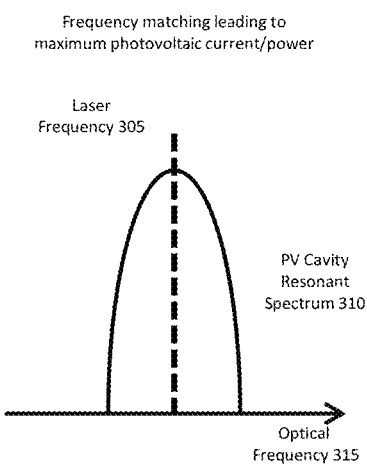
FIG. 3A illustrates how optimal or maximum power is obtained because a peak of the resonant cavity photovoltaic device frequency or wavelength spectrum is at the same point as the laser frequency.
Figure 3B:
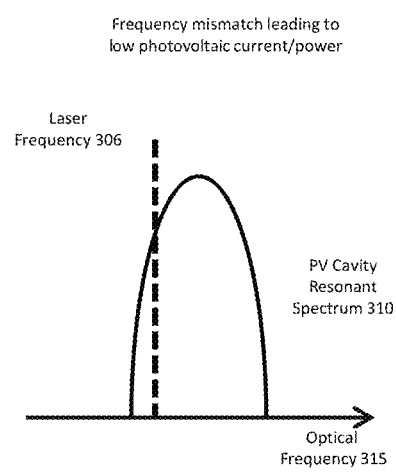
FIG. 3B illustrates where the laser frequency is offset from a peak of the resonant cavity photovoltaic device frequency or wavelength spectrum.

In exemplary embodiments, the power laser subsystem 230 may be optically coupled to the resonant cavity photovoltaic system or device 250 via an optical communication link 241. In exemplary embodiments, the optical communication link 241 may be an optical fiber or may be optical free space channels. In exemplary embodiments, the optical fiber could be a multicore optical fiber. In exemplary embodiments, the laser subsystem 230 may transmit one or more laser light beams over the optical communication link 241 to the resonant cavity photovoltaic subsystem system 250. In exemplary embodiments, the resonant cavity photovoltaic subsystem 250 may receive the one or more laser light beams and convert the light in the one or more laser light beams into electrical energy. In exemplary embodiments, in order to optimize and/or maximize the electrical energy or power generated by the resonant cavity photovoltaic subsystem 250, the laser wavelength or frequency should match or be similar to the resonant operating frequency or wavelength of resonant cavity photovoltaic subsystem 250. The need for matching the operating frequencies or wavelengths of the laser device or subsystem with that of the resonant cavity photovoltaic subsystem is illustrated in FIGS. 3A and 3B. In FIG. 3A, optimal or maximum power is obtained because a peak of the resonant cavity photovoltaic subsystem frequency or wavelength spectrum is at the same point as the power laser frequency or wavelength. Specifically, the resonant cavity photovoltaic subsystem frequency or wavelength spectrum 310 has its largest value at a same or similar point to the laser wavelength or frequency 305. In this alignment, the resonant cavity photovoltaic device 250 may generate a maximum power. This is contrasted to FIG. 3B, where the laser frequency 306 is offset from a peak of the resonant cavity photovoltaic subsystem frequency or wavelength spectrum 310, and electrical power generation is not maximized or optimized.

Returning to FIG. 2, in exemplary embodiments, the power laser subsystem 230 may include an optical antenna 232, a laser device or power laser 234, a laser mount and temperature control device 236, a laser driver 238, an optical power monitor 240, a temperature sensor 242, a temperature controller 244 and/or one or more microcontrollers 246 (which may include a digital signal processor). In exemplary embodiments, the resonant cavity photovoltaic subsystem 250 may include an optical antenna 251, a representative resonant cavity photovoltaic device 255, a battery charger, a battery 265, one or more microcontrollers 270 (which may include a digital signal processor), one or more current sensors 275 and/or one or more temperature sensors 285. In some embodiments, the optical antenna may be a collimator producing a fixed or variable waist free-space beam. More detailed operation of the system to convert light energy to electrical energy is provided below in conjunction with FIG. 4A. In exemplary embodiments, the resonant cavity photovoltaic subsystem 250 may include a battery management system 426. In these embodiments, the battery management system may be coupled or connected to the battery 425 and/or the load 427.

Figure 4A:
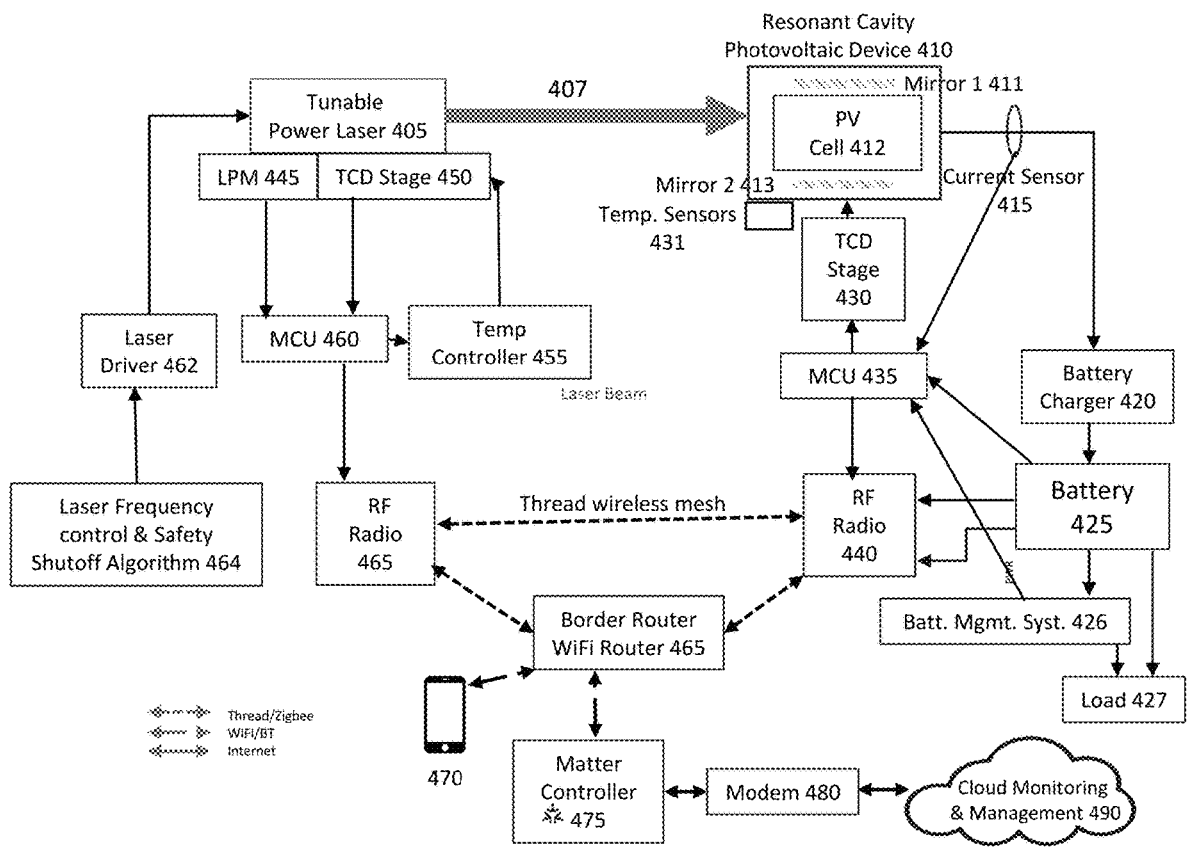
FIG. 4A is a block diagram of a system to convert optical power to electrical power including a battery management system according to exemplary embodiments.

FIG. 4A is a schematic diagram of a system to deliver and convert optical power to electrical power including a power or battery management system according to exemplary embodiments. In exemplary embodiments, a tunable power laser 405 may transmit a plurality of laser light beams at a laser light frequency or wavelength over an optical communication link 407. In exemplary embodiments, the power laser 234 may be connected and/or coupled to a laser mount 236. In exemplary embodiments, the power laser 234 may be optically coupled and/or physically coupled to the optical antenna 232. In some implementations, the tunable power laser 405 may transmit the plurality of laser light beams utilizing the optical antenna 232 through the optical communication link 241. In exemplary embodiments, the plurality of laser light beams may be in a visible light spectrum, or alternatively in a non-visible light spectrum. In some implementations, the optical communication link 407 may be an optical fiber, or alternatively, a free space optical link.

In exemplary embodiments, an optical antenna 251 in the resonant cavity photovoltaic subsystem may be optically coupled to the optical antenna 232 in the laser subsystem 230 through the optical communication link 407. In exemplary embodiments, the resonant cavity photovoltaic device 410 may be optically coupled to the optical antenna 250. In exemplary embodiments, the resonant cavity photovoltaic device 410 may receive the plurality of laser light beams utilizing a first mirror 256 or 411 and a second mirror 413 into the resonant cavity photovoltaic cell 257 or 412 (which will be described in detail below). In exemplary embodiments, the resonant cavity photovoltaic cell 257 may have a resonant operating frequency or wavelength. The resonant cavity photovoltaic cell 257 may convert light from the plurality of laser light beams into electrical energy or power.

In exemplary embodiments, the resonant cavity photovoltaic device 410 may be communicatively coupled to one or more battery chargers 420. In these embodiments, the resonant cavity photovoltaic device 410 may transfer the generated electrical power to the one or more battery chargers 420. In exemplary embodiments, the one or more battery chargers 420 may be coupled or connected to one or more batteries (or rechargeable batteries) 425. In exemplary embodiments, the one or more battery chargers will charge the one or more batteries 425 utilizing the received electrical power. In exemplary embodiments, the one or more batteries 425 may be coupled or connected to a load 427. In these embodiments, the one or more batteries 425 may provide power (e.g., voltage and/or current) to the load 427 in order for the load to operate. This allows power to be provided from the laser subsystem via PBL and/or OWPT. In exemplary embodiments, the load may be other IoT devices on a network such as routers, switches, server computing devices, etc. In exemplary embodiments, the one or more batteries 425 may also be coupled or connected to the wireless communication transceiver 440, the one or more microcontrollers 435, the thermoelectric device 430, the one or more temperature sensors 431 and/or the one or more current sensors 415. In some implementations, the one or more batteries 425 may provide power (e.g., voltage and current) to these components or other components of the photovoltaic cell subsystem 250 or 410. In other words, the photovoltaic cell subsystem 250 or 410 would not need to be plugged into an electrical outlet and instead would be powered via energy or power generated or transmitted by the plurality of laser light beams transmitted from the power laser subsystem.

In exemplary embodiments, as illustrated in FIG. 4A, the resonant cavity photovoltaic device 410 may be coupled to one or more battery chargers 420. In this implementation, the resonant cavity photovoltaic device 410 may deliver the electrical energy to the one or more battery chargers 420. In exemplary embodiments, one or more current sensors 275 (FIG. 2) or 415 may be coupled to the resonant cavity photovoltaic device 410. In exemplary embodiments, the one or more current sensors 415 may measure a current generated by the resonant cavity photovoltaic device 410 and may transmit a current measurement. The current measurement may be utilized to determine if there is a deviation from the resonant operating frequency of the resonant cavity photovoltaic device (and thus there is a lower current being generated than an optimal current that would be expected). In exemplary embodiments, the one or more current sensors 415 may be communicatively coupled to the one or more microcontrollers 270 (FIG. 2) or 435. In exemplary embodiments, the one or more microcontrollers 270 (FIG. 2) or 435 may receive the current measurement from the one or more current sensors.

PV adjustment of current via temperature control. In exemplary embodiments, the one or more microcontrollers 270 or 435 may include one or more memory devices and there may be computer-readable instructions stored in the one or more memory devices. In exemplary embodiments, the computer-readable instructions may be executed by the one or more microcontrollers 270 or 435 to determine if the measured current is lower than a threshold current. If the measured current is less than the threshold current value, then the one or more microcontrollers 270 may generate a temperature control signal. In exemplary embodiments, the one or more microcontrollers 270 or 435 may be communicatively coupled to a temperature control device (TCD) 430. In some embodiments, the temperature control device 430 may be a thermoelectric device (TEC) or a Peltier device. In some embodiments, the temperature control device 430 may be one or more resistive heater elements or a heater device. In exemplary embodiments, the temperature control device 430 may receive the temperature control signal. In exemplary embodiments, the temperature control device 430 may be coupled or connected to the resonant cavity photovoltaic device 410. In exemplary embodiments, the temperature control device 430 may heat or cool the resonant cavity photovoltaic device 410 to adjust the resonant operating frequency or wavelength of the resonant cavity photovoltaic device 410 and thus the current generated by the resonant cavity photovoltaic device 410.

Adjusting wavelength of the laser. In exemplary embodiments, rather than adjusting a temperature of the resonant cavity photovoltaic device 410 (and thus the resonant cavity operating frequency or wavelength of the photovoltaic device 410), it may be more advantageous to adjust an operating frequency or wavelength of the power laser. In these exemplary embodiments, the current sensor 415 may measure a current generated by the resonant cavity photovoltaic and may communicate the current measurement to the one or more microcontrollers 435. If the measured current is less than the threshold current value, then the one or more microcontrollers 270 or 435 may generate a laser control signal. In exemplary embodiments, the one or more microcontrollers 435 may be communicatively coupled to a first wireless communication transceiver 440. In exemplary embodiments, the one or more microcontrollers 435 may communicate the laser control signal to the first wireless communication transceiver 440. In these embodiments, the wireless communication transceiver 440 associated with the resonant cavity photovoltaic subsystem 250 may communicate with a wireless communication transceiver 465 associated with the laser subsystem 230. The wireless communication transceivers 465 or 440 may also be referred to as radiofrequency radios. In exemplary embodiments, a second wireless communication transceiver 465 (associated with the laser subsystem) may be communicatively coupled to the first wireless communication transceiver 440. In exemplary embodiments, the second wireless communication transceiver 465 may receive the laser control signal or message from the first wireless communication transceiver 440. In exemplary embodiments, the second wireless communication transceiver 465 may be communicatively coupled to the one or more microcontrollers 460 in the laser subsystem 230. In some implementations, the second wireless communication transceiver 465 may communicate the laser control signal to the one or more microcontrollers 460. In exemplary embodiments, the one or more microcontrollers 460 may receive the laser control signal. In exemplary embodiments, the one or more microcontrollers 460 in the laser subsystem may be communicatively coupled to the laser driver 462. In exemplary embodiments, the one or more microcontrollers 460 may communicate a command, instruction or signal to the laser driver 462 to instruct the laser driver 462 to adjust or tune a light frequency or wavelength of the tunable power laser 405. In exemplary embodiments, the laser driver 462 may be communicatively coupled to the tunable power laser 405. In exemplary embodiments, the tunable power laser 405 may receive the instruction or signal from the laser driver 462 and may generate a plurality laser light beams with an adjusted laser light frequency or wavelength. In some implementations, the tunable power laser 405 may transmitted a plurality of laser light beams having an adjusted laser light frequency or wavelength, which is based in part on the current measurement generated by the resonant cavity photovoltaic device 410. By adjusting or tuning the generated light frequency or wavelength of the plurality of laser light beams, the adjust laser light frequency or wavelength may again match the resonant cavity operating frequency in order to increase, optimize or maximize the power generated by the resonant cavity photovoltaic device 410. In the Figures, there may be some circumstances where not all lines or connections or couplings can be shown.

Temperature Sensor Tuning in PV Device—In some implementations, one or more temperature sensors 285 (FIG. 2) or 431 may be utilized to capture a temperature measurement in the resonant cavity photovoltaic device 410. In exemplary embodiments, the photovoltaic cell subsystem 250 may further include one or more temperature sensors 285 or 431. In exemplary embodiments, the one or more temperature sensors 285 or 431 may be connected or coupled to the resonant cavity photovoltaic cell 410. In these implementations, the one or more temperature sensors may determine and communication a temperature measurement for the resonant cavity photovoltaic device 410. In exemplary embodiments, the one or more temperature sensors 285 or 431 may be communicatively coupled to the one or more microcontrollers 435. In these embodiments, the one or more microcontrollers 435 may receive the temperature measurement from the one or more temperature sensors 285 or 431. In exemplary embodiments, the one or more microcontrollers 435 may determine if the temperature measurement deviates from an established or expected temperature and if there is a deviation, the one or more microcontrollers 435 may generate a temperature control signal. In these embodiments, the one or more microcontrollers 435 may communicate the generated temperature control signal to the temperature control device 430. In exemplary embodiments, the temperature control device 430 may cool or heat the resonant cavity photovoltaic device 410 based at least in part on the temperature control signal (and thus the temperature measurement from the one or more temperature sensors 285 or 431).

In other embodiments, the power laser frequency or wavelength may need to be turned or adjusted in order to address a number of other operating conditions. Generally, power laser frequency or wavelength turning may involve adjusting an output frequency or wavelength of a power laser system. This capability is imperative with respect to the subject matter described herein because the power laser should be in tune or similar to an operating resonant frequency or wavelength of the resonant cavity photovoltaic (PV) device. Described below are a number of different methods and/or systems for tuning or adjusting power laser frequencies or wavelengths.

In exemplary embodiments, a resonant cavity of the power laser 405 may further include mirrors and/or gratings. In some implementations, the resonant cavity may be physically altered by adjusting positioning, orientation and/or alignment of the one or more mirrors and/or gratings. In some implementations, the one or more mirrors and/or gratings may be rotated and/or moved. This method involves physically altering the resonant cavity of the laser by adjusting components such as mirrors or gratings. Rotating or shifting the one or more mirrors or gratings may change a cavity length in the power laser and thus allow or cause frequency or wavelength changing or selection. In exemplary embodiments, the laser subsystem 230 may include a laser frequency control module 464, which may be communicatively coupled to the laser driver 462. In exemplary embodiments, instructions, commands and/or signals may be communicated from the laser frequency control module 464 to the laser driver 462 to move and/or adjust the one or more mirrors or gratings, which may result in a change of laser frequency or wavelength. Because this process is mechanical in nature, it is a slower process and may not be suitable for implementations or applications requiring rapid and/or precise tuning.

In some implementations, the laser frequency or wavelength may be changed by changing or altering an operating temperature of the power laser. In exemplary embodiments, the laser subsystem 230 may include a power laser device 235 or 405, one or more temperature sensors 242, a temperature controller 244 or 455 and/or a thermoelectric device 236 or 450. In exemplary embodiments, the one or more temperature sensors 242 may be coupled or connected to a temperature controller 244 or 455. In exemplary embodiments, the one or more temperature sensors 242 may measure a temperature of the power laser device 234 or 405 and generate a temperature measurement. In exemplary embodiments, the one or more temperature sensors 242 may communicate the temperature measurement to the temperature controller 244 or 455. In some implementations, the one or more temperature sensors 242 may be communicatively coupled to the one or more microcontrollers 460, which may be communicatively coupled to the temperature controller 244 or 455. In this implementation, the one or more temperature sensors 242 may communicate the temperature measurement to the one or more microcontroller 246 or 460, which may then communicate commands, instructions or signals to the temperature controller 244 or 455. In exemplary embodiments, the temperature controller 244 or 455 may be communicatively coupled to the temperature control device 236 or 450. In exemplary embodiments, the temperature controller 455 may communicate instructions, commands or signals to the thermoelectric device 236 or 455 to cool or heat the power laser device 234 or 405 in order to adjust the laser light frequency or wavelength transmitted by the power laser device. In some implementations, the temperature controller 455 may determine the instruction, command or signal to be transmitted based on the received temperature measurement. In other implementations, the one or more microcontrollers 246 or 460 may determine the instruction, command or signal to be transmitted to the temperature controller 244 or 455 which in turn will communicate a signal, command or instruction to the thermoelectric device 236 or 450 to cool or heat the power laser device 234 or 405. In some implementations, this temperature adjustment method may be quite precise but may not cover a wide range of frequencies or wavelengths of the power laser device.

Another method or system to change a frequency or wavelength of the power laser device 234 or 405 is a utilization of current injection techniques. With this method, an injected current for the power laser device may be varied, which may then vary an output wavelength or frequency of the power laser device 234 or 405. In exemplary embodiments, a laser frequency control module 464 may be communicatively coupled to the laser driver. In some implementation, the laser frequency control module 464 may generate a frequency variation control signal and may communicate the frequency variation control signal to the laser driver 238 or 462. In these implementations, the laser driver 238 or 462 may transmit an input current to the power laser device 234 or 405 and if the input current is varied, the output wavelength or frequency of the power laser device 234 or 405 will also be varied. In exemplary embodiments, variation of the injected current may alter properties of a semiconductor material of which the power laser device 234 or 405 is made of, which may cause a change in the power laser device 234 or 405 emitted or output wavelength or frequency. In some implementations, this current injection method may have limited frequency or wavelength tuning ranges.

In exemplary embodiments, a power laser device 234 or 405 may include an external cavity. In some implementations, the external cavity may allow for more flexibility in wavelength or frequency tuning because a wider range of wavelengths or frequencies may be adjusted and may be adjusted with a higher precision. In exemplary embodiments, the power laser device 234 or 405 may further include additional gratings and/or prisms, which may allow an operating wavelength or frequency to be adjusted over a wider or broader range of frequencies and wavelengths.

In exemplary embodiments, a laser subsystem 230 may include a second wireless communication transceiver 465 and the photovoltaic cell subsystem may include a first wireless communication transceiver 440. In exemplary embodiments, the light energy to electrical energy conversion system may further include a border router or a WiFi router 465. In exemplary embodiments, the light energy to electrical energy conversion system 400 may include one or more mobile communication devices 470. In exemplary embodiments, the light energy to electrical energy conversion system 400 may include a matter controller 475. In exemplary embodiments, the light energy to electrical energy conversion system 400 may further include a modem 480 and/or a cloud monitoring and management server computing device 490. In exemplary embodiments, the first wireless communication transceiver 440 may communicate with the second wireless communication transceiver 465 utilizing a wireless communication protocol. In some implementations, the wireless communication protocol may be the Thread wireless protocol and/or, in alternative embodiments, the wireless communication protocol may be a Zigbee protocol. This allows the photovoltaic cell subsystem 250 to communicate with the laser subsystem 230.

In exemplary embodiments, one or more mobile communication devices 470 may be communicatively coupled to the border router (or WiFi router) 465. In some implementations, the first wireless communication transceiver 440 and the second wireless communication transceiver 465 may be communicatively coupled to the border router or WiFi router 467. In some implementations, the first wireless communication transceiver 440 and the second wireless communication transceiver 465 may communicate with the border router (or WiFi router) 467 utilizing a Thread wireless protocol, or alternatively utilizing a Zigbee wireless protocol. In exemplary embodiments, the one or more mobile communication devices 467 may communicate with the border router (or WiFi router) 467 utilizing a wireless communication protocol. In some implementations, the wireless communication protocol may be a WiFi protocol, or alternatively, a Bluetooth protocol. In these implementations, the one or more mobile communication devices 470 may thus communicate with the laser subsystem 230 and/or the photovoltaic cell subsystem 250 to provide commands or instructions, to provide data logging, and/or to monitor operation of the laser subsystem 230 and/or the photovoltaic cell subsystem 250 (e.g., the light energy to electrical energy conversion system)

In exemplary embodiments, a manager, an administrator or other information technology (IT) personnel may monitor and/or manage a plurality of laser subsystems 230 and photovoltaic cell subsystems 250. In these embodiments, the manager, administrator or IT personnel can determine if the plurality of laser subsystems 230 and photovoltaic cell subsystems 250 are operating correctly and/or efficiently. In addition, the manager, administrator or IT personnel may determine if troubleshooting and/or maintenance is needed. Additionally, the manager, administrator or IT personnel may adjust and/or modify specific aspects of the plurality of laser subsystems 230 and the plurality of photovoltaic cell subsystems 250 (e.g., a wavelength or frequency or a temperature of the power laser device 234 and/or the wavelength or frequency or temperature of the resonant cavity photovoltaic cell 250). In exemplary embodiments, computer-readable instructions stored on one or more memory devices in a cloud monitoring and management server 490 may be executable by one or more processors in the cloud monitoring and management server 490 in order to perform the functions described above. In exemplary embodiments, the border router 467 may be communicatively coupled to a matter controller 475. In exemplary embodiments, the matter controller 475 may be communicatively coupled to a modem 480. In exemplary embodiments, the modem 480 may be communicatively coupled to the cloud monitoring and management server computing device 490. In these implementations, a user may initiate software on the cloud monitoring and management server computing device 490 and may communicate instructions, commands or messages via the modem 480 to the matter controller 475. In these implementations, the matter controller may communicate or transmit the instructions, commands or messages to the border router (or WiFi router) 467 and the border router (or WiFi router) 467 may communicate the instructions, commands or messages to the first wireless communication transceiver 440 (in order to communicate with the one or more photovoltaic cell subsystems 250) or to the second wireless communication transceiver 465 to communicate with the power laser subsystem 230. This allows users (e.g., administrators, IT professionals or managers to manage operation of the one or more power laser devices 234 and/or the one or more photovoltaic cell subsystems 250.

FIG. 4A also is a block diagram of a system to convert optical power to electrical power including a power management system according to exemplary embodiments. In exemplary embodiments the resonant cavity photovoltaic subsystem 250 may further include a battery management system or subsystem 426, which is coupled to the one or more batteries 425. In these embodiments, the one or more batteries 425 may still provide power to the load 427, while the battery management system 426 is monitoring operation of the one or more batteries 425. In exemplary embodiments, the battery management system 426 may receive battery voltage measurements, battery current measurements, battery power measurements, battery status parameters (e.g., whether the battery is functioning or operating correctly) and/or the battery charge state parameters. In exemplary embodiments, the battery management system may also be communicatively coupled and/or connected to the one or more microcontrollers or processors 435. In exemplary embodiments, the battery management system 426 may receive battery voltage measurements, battery current measurements and/or battery power measurements. In these embodiments, if the battery current, voltage and/or power measurements are outside an acceptable range and/or are higher than a set threshold, the battery management system 426 may communicate a message and/or signal to the one or more microcontrollers 435 to communicate with the power laser subsystem 230. This message or signal instructs the power laser subsystem to adjust power output from the tunable power laser 405 up or down based at least in part on the message and/or signal communicated from the battery management system 426. The wireless communication between the MCU 435 in the resonant cavity photovoltaic subsystem 250 and the MCU 460 in power laser subsystem 230 is described in detail above.

In exemplary embodiments, the battery management subsystem 426 may receive battery charge state parameters from the one or more batteries (e.g., how much a charge is still left to provide power to the load 427). In these embodiments, if the battery charge state parameters are outside an acceptable range (e.g., the charge state is too high or too low), the battery management system 426 may communicate a signal and/or message to the one or more microcontrollers 435 to communicate with power laser subsystem 230 to adjust a power output from the tunable power laser 405. As an example, if the charge state parameters indicate the power has a low charge state and may not be able to provide power to the load in the near future, the battery management system 426 may send a message and/or signal to the one or more MCUs 435 to communicate with the power laser subsystem to increase the power output by the tunable power laser 405 and thus increase the voltage or current provided to the battery charger 420 and thus the battery 425. The wireless communication between the MCU 435 in the resonant cavity photovoltaic subsystem 250 and the wireless communications devices in the power laser subsystem 230 is described in detail above. In exemplary embodiments, the battery management system 426 may receive battery status messages from the one or more batteries 425. In exemplary embodiments, depending on a nature of the battery status messages, the battery management subsystem 426 may communicate with one or more of the batteries 425 to shut down or cease operation. In some implementations, the battery management system 426 may communicate with the one or more microcontrollers 435 to identify status of the one or more batteries 425.

Figure 4B:
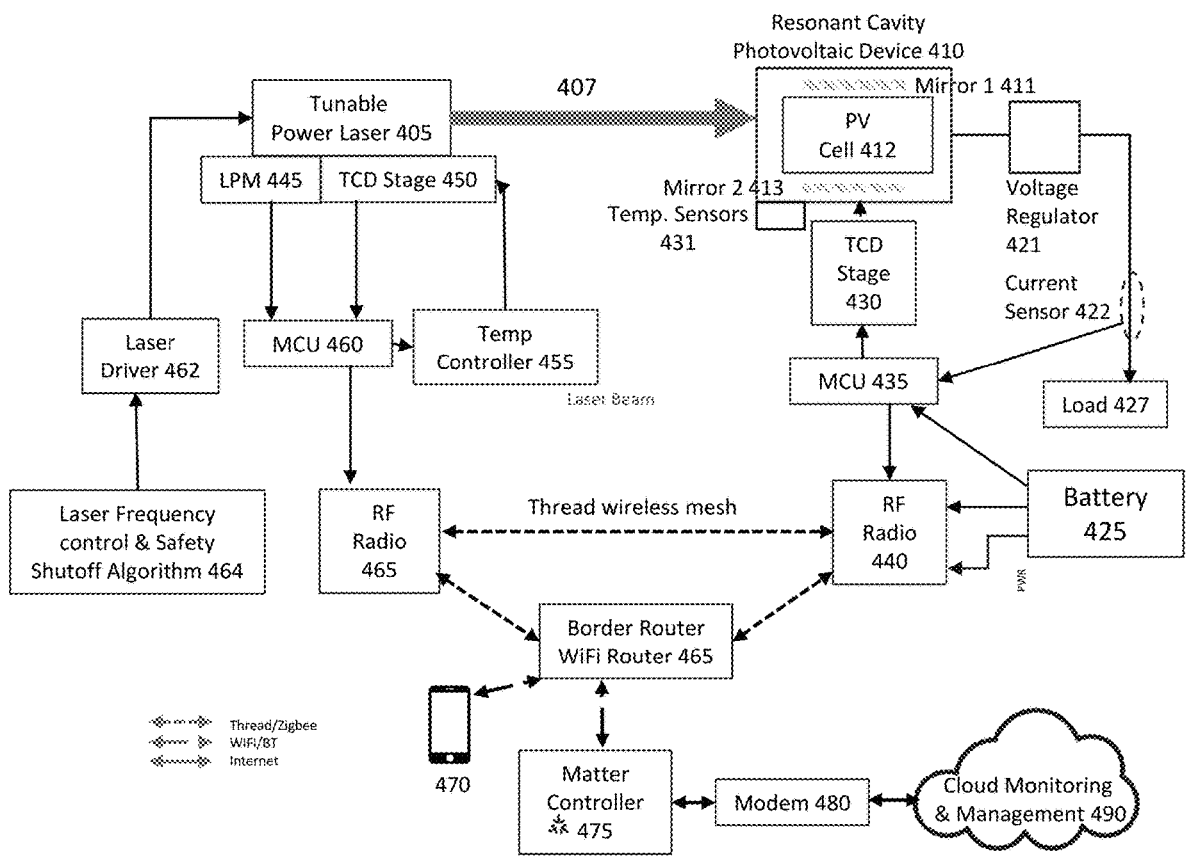
FIG. 4B is a block diagram of a system to convert optical power to electrical power according to exemplary embodiments.

FIG. 4B illustrates a block diagram of a system to convert optical power to electrical power including a different charging system according to exemplary embodiments. In FIG. 4B, the resonant cavity photovoltaic subsystem 250 may include a voltage regulator 421, one or more current sensors 422 and/or the load 427 that is being powered. In exemplary embodiments, the resonant cavity photovoltaic device 410 may be coupled and/or connected to the voltage regulator 421 and the voltage regulator 421 may be coupled and/or connected to the one or more current sensors 422 and/or the load 427. In these embodiments, the power being generated by the resonant cavity photovoltaic device may be the same or close to the power being consumed by the load. In these embodiments, the power generated by the resonant cavity photovoltaic cell 412 may be supplied to the voltage regulator 421. In these embodiments, the voltage regulator 421 may supply the voltage and current to the load 427 to power the load. In these embodiments, the one or more current sensors 422 may monitor power that is delivered to the load 427. In some implementations, the one or more current sensors 422 may be Hall sensors. In exemplary embodiments, the one or more current sensors 422 may communicate the current measurement to the one or more microcontrollers 435. In exemplary embodiments, the one or more microcontrollers 435 may determine if the current measurement is outside an acceptable range. If the one or more microcontrollers 435 determines the current measurement is outside the acceptable range, the one or more microcontrollers 435 may communicate a message and/or a command to the power laser subsystem 230 to increase and/or decrease power generated by the tunable power laser 405. The wireless communication between the one or more MCUs 435 in the resonant cavity photovoltaic subsystem 250 and/or the one or more MCUs 460 in the power laser subsystem 230 is described above. As an illustrative example, if the one or more current sensors generate a low current measurement which is communicated to the one or more MCUs 435, the one or more MCUs 435 may communicate a signal, command or message to the power laser subsystem 230 to increase power of the tunable power laser 405.

Figure 5A:
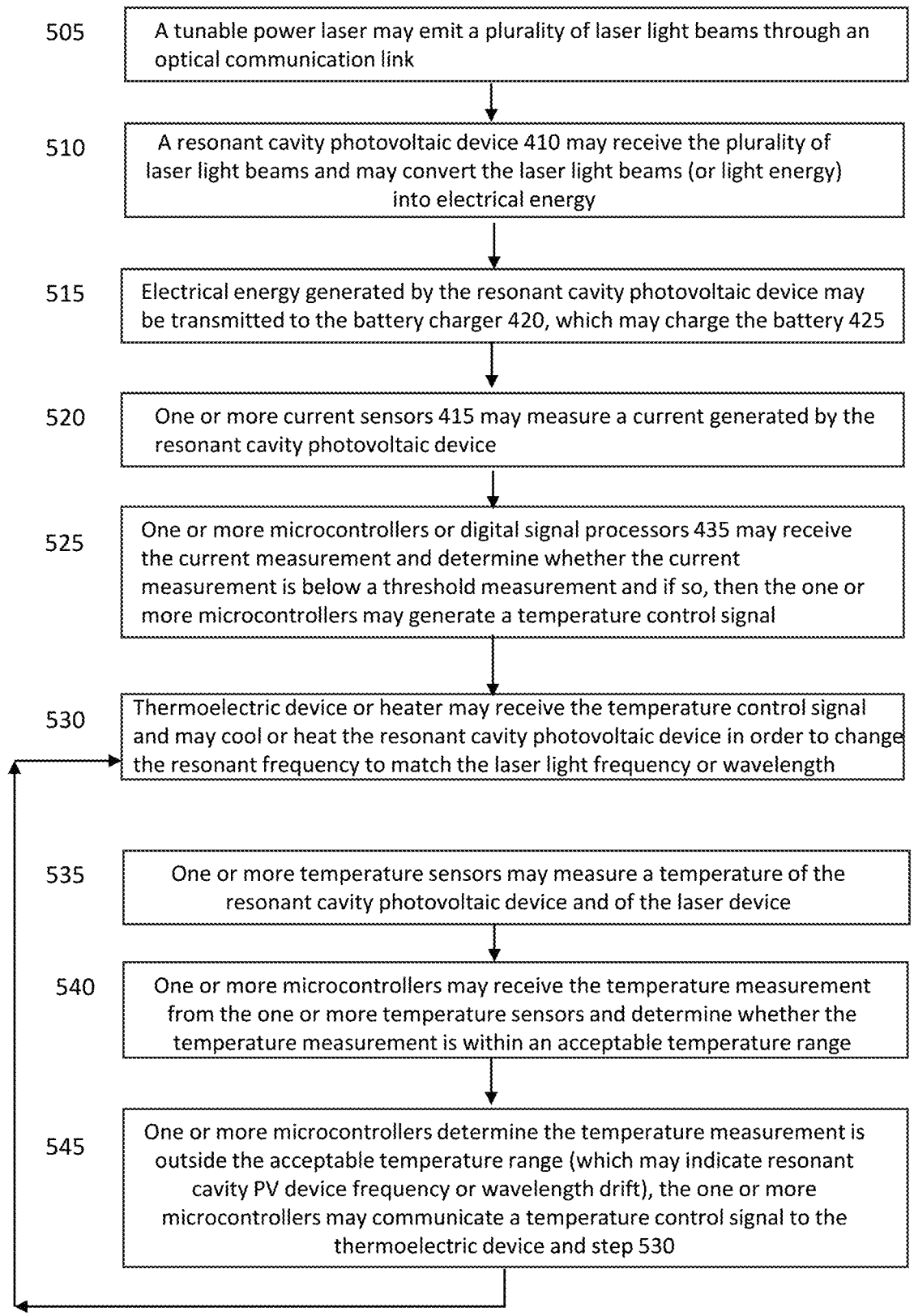
FIG. 5A illustrates a flowchart of operation of a light energy to electrical energy conversion system according to exemplary embodiments.
Figure 5B:
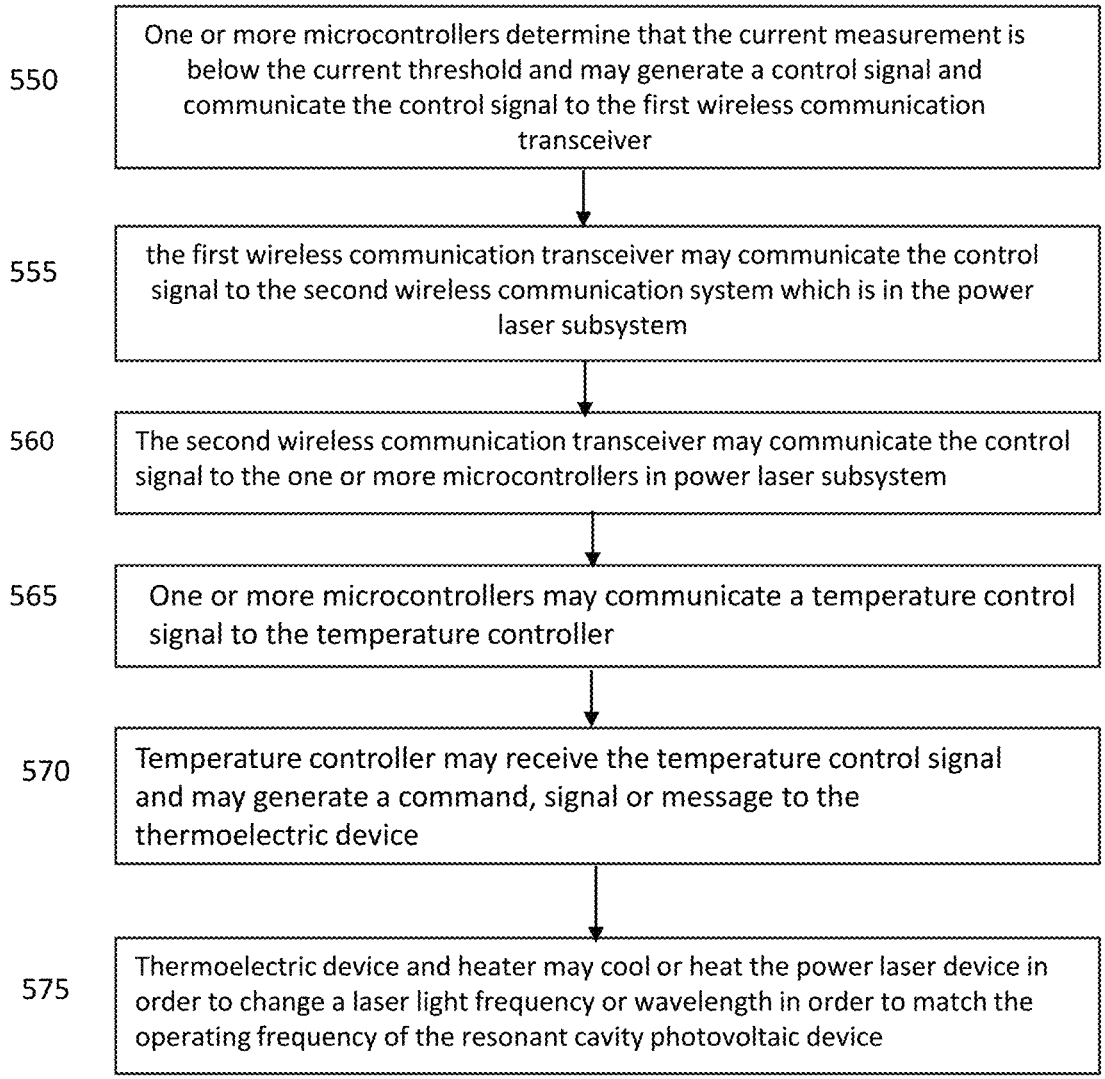
FIG. 5B illustrates a flowchart of operation of a light energy to electrical energy conversion system according to exemplary embodiments.

FIGS. 5A and 5B illustrate a flowchart of operation of a light energy to electrical energy conversion system according to exemplary embodiments. In exemplary embodiments, in step 505, a tunable power laser 405 may emit a plurality of laser light beams through an optical communication link (e.g., an optical fiber or a free space optical link). In exemplary embodiments, in step 510, a resonant cavity photovoltaic device 410 may receive the plurality of laser light beams and may convert the laser light beams (or light energy) into electrical energy. In some implementations, a Fabry-Perot resonator utilizes two mirrors and a photovoltaic PN junction to convert the plurality of laser light beams into electrical energy. In some implementations, a grating coupler, an optical waveguide, a directional coupler, and/or a pn junction waveguide ring resonator may receive the plurality of laser light beams (or light energy) and convert the laser light beams into electrical energy. In order to provide an optimal amount of power, the resonant cavity photovoltaic device's resonant operating frequency or wavelength may match a power laser light frequency or wavelength. In exemplary embodiments, in step 515, the electrical energy generated by the resonant cavity photovoltaic device may be transmitted to the battery charger 420, which may charge the battery 425 (which later may provide power to a load (e.g., optical routers, switches, computing devices, etc.). In exemplary embodiments, in step 520, one or more current sensors 415 may measure a current transmitted or transferred from the resonant cavity photovoltaic device. In exemplary embodiments, in step 525, the one or more microcontrollers or digital signal processors 435 may receive the current measurement and determine whether the current measurement is below a threshold measurement and if so, then the one or more microcontrollers may generate a temperature control signal. If the one or more microcontrollers identify the current measurement is below the current threshold, this is an indication that the resonant frequency or wavelength is drifting and may not match the laser light frequency or wavelength. In exemplary embodiments, in step 530, the thermoelectric device may receive the temperature control signal and may cool or heat the resonant cavity photovoltaic device in order to change a frequency or wavelength to match the laser light frequency or wavelength.

In exemplary embodiments, in step 535, one or more temperature sensors may measure a temperature of the resonant cavity photovoltaic device. In exemplary embodiments, in step 540, the one or more microcontrollers may receive the temperature measurement from the one or more temperature sensors and determine whether the temperature measurement is within an acceptable temperature range. In exemplary embodiments, in step 545, if the one or more microcontrollers determine the temperature measurement is outside the acceptable temperature range (which may indicate resonant cavity PV device frequency or wavelength drift), the one or more microcontrollers may communicate a temperature control signal to the temperature control device and step 530 may be performed (e.g., a temperature control device may generate a command or signal to the resonant cavity PV device to cool down or heat up).

In exemplary embodiments, rather than heat or cool the thermoelectric device of the resonant cavity PV device, the resonant cavity photovoltaic system may communicate with the power laser subsystem. In exemplary embodiments, in step 550, the one or more microcontrollers determine that the current measurement is below the current threshold and may generate a control signal and communicate the control signal to the first wireless communication transceiver. In exemplary embodiments, in step 555, the first wireless communication transceiver may communicate the control signal to the second wireless communication system which is in the power laser subsystem. In exemplary embodiments, in step 560, the second wireless communication transceiver may communicate the control signal to the one or more microcontrollers 460 in power laser subsystem. In exemplary embodiments, in step 565, the one or more microcontrollers may communicate a temperature control signal to the temperature controller. In exemplary embodiments, in step 570, the temperature controller may receive the temperature control signal and may generate a command, signal or message to the temperature control device. In exemplary embodiments, in step 575, the temperature control device may cool or heat the power laser device in order to change a laser light frequency or wavelength in order to match the operating frequency of the resonant cavity photovoltaic device.

FIG. 6A illustrates a Fabry-Perot resonator embodiment of a resonant cavity photovoltaic device according to some embodiments. In exemplary embodiments, the Fabry-Perot resonant cavity voltaic device 600 may include a diffuser 610, a first mirror 615, a photovoltaic PN junction diode 620 and/or a second mirror 625. In exemplary embodiments, the diffuser 610 may be positioned on top of a first mirror 615. In exemplary embodiments, the first mirror 615 may be positioned on top of the photovoltaic PN junction 620. In exemplary embodiments, the photovoltaic PN junction 620 may be positioned on top of a second mirror 625. In some implementations, the first mirror 615 may be a partial reflectance mirror 615. In some implementations, the second mirror 625 may be a reflecting mirror or a total reflectance mirror. In exemplary embodiments, a plurality of laser light beams 605 may be transmitted to the Fabry-Perot resonant cavity voltaic device 600 and may pass through the diffuser 610. In exemplary embodiments, after passing through the diffuser, a portion of the plurality of the laser light beams may pass through the first mirror 615 (e.g., a partial reflectance mirror). In exemplary embodiments, the portion of the plurality of laser light beams passing through the first mirror 615 may enter the photovoltaic PN junction device 620 and may be converted from light energy into electrical energy. In exemplary embodiments, a portion of the plurality of laser light beams may reach the second mirror 625 and be reflected back into the photovoltaic PN junction 620 where the reflected light may also be converted into electrical energy. In another exemplary embodiment, a micro lens array may replace the diffuser.

FIG. 6B illustrates a ring resonator embodiment of a resonant cavity photovoltaic device according to exemplary embodiments. In exemplary embodiments, the ring resonator embodiment 650 may include a grating coupler 651, an optical waveguide 655, a directional coupler 660 and/or a pn junction waveguide ring resonator 665. In exemplary embodiments, the grating coupler 651 may be positioned next to and coupled to an optical waveguide 655. In exemplary embodiments, the directional coupler 660 may be coupled to the optical waveguide 655. In exemplary embodiments, the directional coupler 660 may be coupled to the pn junction waveguide ring resonator 665. In exemplary embodiments, laser light from the plurality of laser light beam may be transmitted and enter the grating coupler 651 at a direction nearly perpendicular to a plane of the grating coupler 651. In exemplary embodiments, the plurality of laser light beams may be directed through the grating coupler to the optical waveguide 655. In exemplary embodiments, laser light may be coupled to the directional coupler 660. In exemplary embodiments, the laser light entering the directional coupler 660 may be passed to the PN junction waveguide ring resonator 665. In exemplary embodiments, the PN junction waveguide ring resonator 665 may convert the received laser light (e.g., light energy) into electrical energy.

Temperature control of the power laser is critical and a selection of a appropriate laser mount and a temperature control device is imperative for proper operation of the power laser device. As noted previously, the subject matter described herein (in order to have an efficient energy deliver) should have a frequency or wavelength of the power laser device match or be close to the resonant operating frequency or wavelength of the resonant photovoltaic (PV) device. The power laser device may dissipate heat during operation and the heat of the power laser device may cause drift to the power laser device frequency or wavelength. It is pivotal to manage heat generated during power laser operation to maintain optimal performance of the power laser device.

In the power laser subsystem 230 of the light energy to electrical energy conversion system, two primary strategies may be utilized for heat dissipation: 1) passive cooling, which involves conducting heat away from the power laser device using a heat sink, and 2) active cooling, a more complex approach employing a Peltier cooler or thermoelectric device to regulate temperature of the power laser device. Active cooling and passive cooling are described herein, but similar active or passive techniques may be utilized in active heating and passive heating.

Figure 7A:
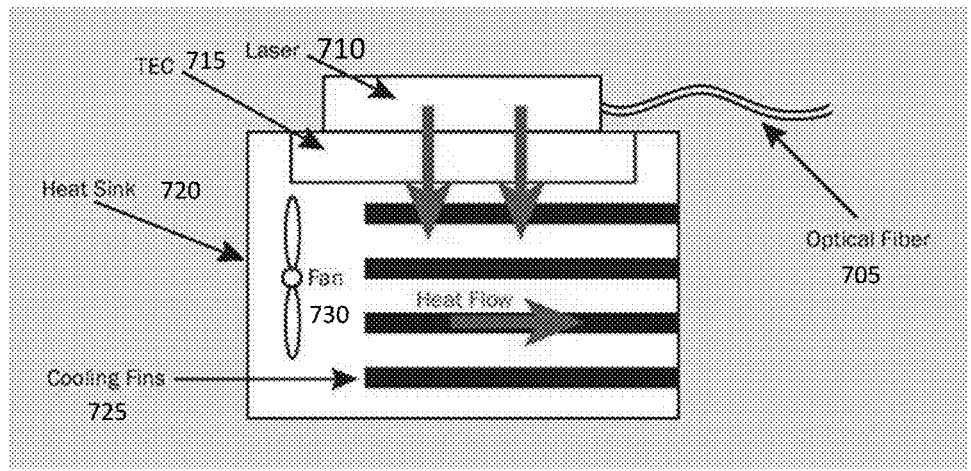
FIG. 7A illustrates a passively cooled laser subsystem mount according to exemplary embodiments.

With respect to passive cooling, the laser subsystem dissipates heat incrementally into the ambient air. The power laser mount's thermal performance may be measured in thermal resistance (° C./W). The utilization of passive cooling is suitable for low to medium power applications. FIG. 7A shows a passively cooled laser subsystem mount according to exemplary embodiments. In exemplary embodiments, the passively cooled laser subsystem mount 700 may include a power laser 710, a thermoelectric device 715, an optical fiber 705, a heat sink 720, one or more fans 730 and/or one or more cooling fins. In exemplary embodiments, the power laser 710 may be mounted onto a thermoelectric device 715. In exemplary embodiments, the thermoelectric device may be mounted or connected to a heat sink 720. In exemplary embodiments, the power laser 710 may be coupled and/or connected to an optical fiber 705. In exemplary embodiments, the heat sink 720 may include a fan 730 and/or cooling fins 725. In exemplary embodiments, the heat flow moves from the power laser 710 to the thermoelectric device 715 to the heat sink. In exemplary embodiments, the one or more fans 730 push the ambient air away from the heat sink 720 and the one or more cooling fins 725 also dissipate the heat from the heat sink 720.

Figure 7B:
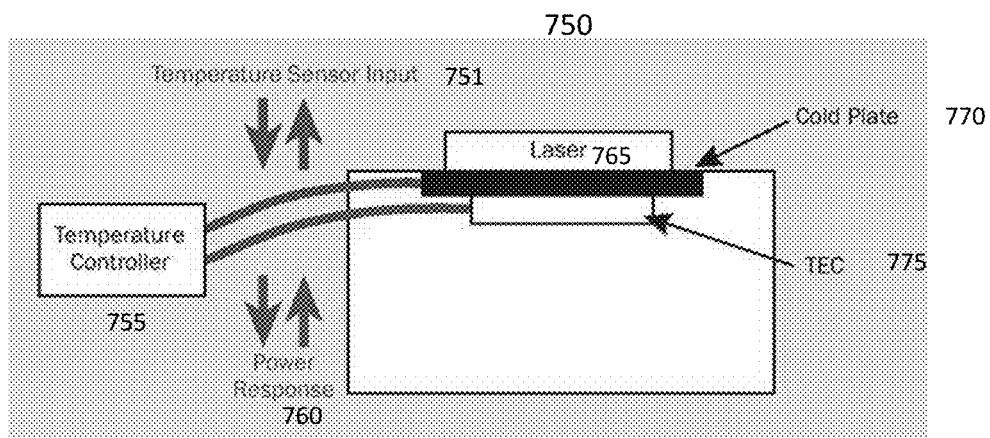
FIG. 7B illustrates an actively cooled laser subsystem mount according to exemplary embodiments.

With respect to active cooling, an active cooling system may utilize a Peltier cooler controlled by a temperature sensor and/or a temperature controller, which provides better thermal management capacity. In other embodiments, acting heating may be necessary. Active cooling allows for precise temperature control crucial for maintaining the power laser's optimal performance. FIG. 7B illustrates an actively cooled laser subsystem mount according to exemplary embodiments. In exemplary embodiments, the actively cooled laser subsystem 750 includes temperature sensor input 751, a power laser device 765, a cold plate 770, a thermoelectric device or Peltier device 775, a temperature controller 755 and/or a power input or response 760. In exemplary embodiments, the power laser 765 may be mounted on top of a cold plate 770 and the cold plate 770 may be mounted on top of a thermoelectric or Peltier device 775. In exemplary embodiments, the temperature controller 755 may be connected or coupled to a cold plate 770 and/or a thermoelectric or Peltier device 775. In exemplary embodiments, a temperature measurement may be received from one or more temperature sensors by the temperature controller 755 and the temperature controller may send a command/or signal to the thermoelectric or Peltier device 775 in order to provide heat to the power laser 765 or may communicate a command and/or signal to the cold plate 770 to cool down the power laser device 765. In other embodiments, where active heating is required, the thermoelectric device and cold plate may be replaced by a temperature control or heater device and one or more resistive heating elements.

In exemplary embodiments, it is imperative when selecting a laser mount for a power laser device to focus on thermal conductivity, a flexible wiring harness, and/or mechanical connections between the power laser 710 or 765 and the laser mount and/or thermoelectric device 715 or 775. In exemplary embodiments, connections may be made utilizing copper is preferred to optimize thermal conductivity. Further, easy-to-establish connections are crucial for efficiency.

In high-power and high-temperature systems, a high-power laser may be cooled and/or mounted utilizing water-cooled mounts in order to provide higher thermal capacity. In these implementations, a setup of and the complexity of the water-cooled laser mount may increase setup time and/or cost of a system. In specific high-temperature applications utilizing power lasers and the subject matter described herein, a combination of Peltier cooling devices and resistive heaters may be necessary to cool and/or heat the laser subsystem.

In exemplary embodiments, a system to deliver power via one or more laser beams may include a laser device, the laser device to generate the one or more laser light beams, the one or more laser light beams to communicate power signals and optional data signals, the one or more laser light beams having a first laser wavelength or frequency; and a resonant cavity photovoltaic device configured to receive the one or more laser light beams and to convert the one or more laser light beams to electrical power, wherein the resonant cavity photovoltaic cell has a first resonant operating frequency or wavelength that is similar to or matches the first laser frequency or wavelength. In exemplary embodiments, the system may further include one or more first microcontrollers coupled to the resonant cavity photovoltaic device; a first wireless communication transceiver coupled to the first microcontroller; one or more second microcontrollers coupled to a laser driver; a second wireless communication transceiver coupled to the one or more second microcontrollers; and a first router device coupled to the first wireless communication transceiver and the second wireless communication transceiver, wherein the first wireless communication transceiver and the second wireless communication transceiver are configured to communicate with the first router device.

In exemplary embodiments, the system may further include a wireless controller transceiver coupled to the first router device; a first modem coupled to the wireless controller transceiver; and a cloud monitoring & management server computing device coupled to the first modem, the cloud monitoring and management server computing device including: one or more processors; one or more memory devices; and computer-readable instructions executable by the one or more processors to communicate with the first wireless communication transceiver and the second wireless communication transceiver via the first modem, the first wireless controller transceiver and the first router device to obtain measurements and parameters from the laser device, the resonant cavity photovoltaic device, the battery charger or the rechargeable battery. In exemplary embodiments, the system may further include a mobile computing device, the mobile computing device including one or more processors, one or more memory devices and computer-readable instructions executable by the one or more processors to communicate with the first wireless communication transceiver and the second wireless communication transceiver via the first router device to obtain parameters and/or measurements from the laser device, the resonant cavity photovoltaic device, the battery charger or the rechargeable battery.

In exemplary embodiments, the resonant cavity photovoltaic device may include a photovoltaic diode, a first mirror and a second mirror, where the first mirror is a partially reflective mirror and the one or more laser light beams partially passes through the first mirror to the photovoltaic diode and the second mirror captures incident light from the one or more laser light beams, and wherein the first mirror and the second mirror are distributed bragg reflecting structures. In exemplary embodiments, the resonant cavity photovoltaic device may include a pn junction optical waveguide ring resonator, a grating coupler device, an optional directional coupler and an optical waveguide, wherein the grating coupler device is configured to direct the one or more laser light beams into the optical waveguide and the optical directional coupler is configured to couple the one or more laser light beams into the pn junction optical waveguide ring resonator, the pn junction optical waveguide ring resonator to convert the one or more laser light beams into the electrical current or electrical power.

In exemplary embodiments, the laser device in the system is configured to communicate the one or more laser light beams to the resonant cavity photovoltaic device via an optical fiber. In other embodiments, the laser device in the system is configured to communicate the one or more laser light beams via free space. In exemplary embodiments, the resonant cavity photovoltaic device may include a material opposite in thermal coefficient to an original material in the resonant cavity photovoltaic device to maintain thermal stability in the resonant cavity photovoltaic device.

In exemplary embodiments, a method of making a resonant cavity photovoltaic receiver device includes fabricating a resonant cavity photovoltaic cell, the resonant cavity photovoltaic cell comprising one or more materials including silicon, a CdTe compound, a GaAs compound, an InP based compound, a copper indium gallium selenide (CIGS), Perovskites materials, or Dye-sensitized Solar Cells (DSCs); bonding a first Bragg partial reflector to a top surface of the resonant cavity photovoltaic cell configured to receive the one or more laser light beams from a laser device; and bonding a second Bragg reflector to a bottom surface of the resonant cavity photovoltaic cell to capture and reflect incident laser light from the one or more laser light beams to the resonant cavity photovoltaic cell, wherein the first Bragg reflector and the second Bragg reflector are configured to increase light absorption in the resonant cavity photovoltaic cell and increase efficiency of a converting light energy of the one or more laser light beams into electrical energy/current.

In exemplary embodiments, a method of communicating power from a laser device to a photovoltaic receiving device includes transmitting one or more laser light beams including power signals from the laser device, the one or more laser light beams having a first wavelength; receiving the one or more laser light beams including power signals at the resonant cavity photovoltaic device configured to convert the one or more laser light beams into electrical energy or current, wherein the resonant cavity photovoltaic device has a wavelength that matches the first wavelength of the one or more laser light beams; and communicating the converted electrical energy/current to a second device or rechargeable battery. In exemplary embodiments, the one or more light beams are transmitted via an optical fiber and in other implementations, the one or more laser beams are transmitted via free space power delivery.

While various embodiments described in the present disclosure have been described above, it should be understood that they have been presented by way of example, and not limitation. It is to be understood that various changes in form and detail can be made therein without departing from the scope of the present disclosure. In addition to using hardware (e.g., within or coupled to a central processing unit ("CPU"), microprocessor, micro controller, digital signal processor, FPGA, GPU, processor core, system on chip ("SOC") or any other device), implementations may also be embodied in software (e.g. computer readable code, program code, and/or instructions disposed in any form, such as source, object or machine language) disposed for example in a non-transitory computer-readable medium configured to store the software. Such software can enable, for example, the function, fabrication, modeling, simulation, description and/or testing of the apparatus and methods describe herein. For example, this can be accomplished through the use of general program languages (e.g., C, C++), hardware description languages (HDL) including Verilog HDL, VHDL, and so on, or other available programs. Such software can be disposed in any known non-transitory computer-readable medium, such as semiconductor, magnetic disc, or optical disc (e.g., CD-ROM, DVD-ROM, etc.). The software can also be disposed as computer data embodied in a non-transitory computer-readable transmission medium (e.g., solid state memory any other non-transitory medium including digital, optical, analog-based medium, such as removable storage media). Embodiments of the present disclosure may include methods of providing the apparatus described herein by providing software describing the apparatus and subsequently transmitting the software as a computer data signal over a communication network including the internet and intranets.

Although illustrated as separate elements, the method steps described and/or illustrated herein may represent portions of a single application. In addition, in some embodiments one or more of these steps may represent or correspond to one or more software applications or programs that, when executed by a computing device, may cause the computing device to perform one or more tasks, such as the method step.

In addition, one or more of the devices described herein may transform data, physical devices, and/or representations of physical devices from one form to another. For example, one or more of the devices recited herein may receive image data of a sample to be transformed, transform the image data, output a result of the transformation to determine a 3D process, use the result of the transformation to perform the 3D process, and store the result of the transformation to produce an output image of the sample. Additionally or alternatively, one or more of the modules recited herein may transform a processor, volatile memory, non-volatile memory, and/or any other portion of a physical computing device from one form of computing device to another form of computing device by executing on the computing device, storing data on the computing device, and/or otherwise interacting with the computing device.

A person of ordinary skill in the art will recognize that any process or method disclosed herein can be modified in many ways. The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed.

The various exemplary methods described and/or illustrated herein may also omit one or more of the steps described or illustrated herein or comprise additional steps in addition to those disclosed. Further, a step of any method as disclosed herein can be combined with any one or more steps of any other method as disclosed herein.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and shall have the same meaning as the word "comprising."

The processor as disclosed herein can be configured with instructions to perform any one or more steps of any method as disclosed herein.

As used herein, the term "or" is used inclusively to refer items in the alternative and in combination.

As used herein, characters such as numerals refer to like elements.

Embodiments of the present disclosure have been shown and described as set forth herein and are provided by way of example only. One of ordinary skill in the art will recognize numerous adaptations, changes, variations and substitutions without departing from the scope of the present disclosure. Several alternatives and combinations of the embodiments disclosed herein may be utilized without departing from the scope of the present disclosure and the inventions disclosed herein. Therefore, the scope of the presently disclosed inventions shall be defined solely by the scope of the appended claims and the equivalents thereof.

What is claimed is:

1. A system to deliver power via one or more laser beams, comprising:
   a laser device, the laser device configured to generate the one or more laser light beams, the one or more laser light beams to communicate power signals and optional data signals, the one or more laser light beams having a first laser wavelength or frequency;
   a resonant cavity photovoltaic device configured to receive the one or more laser light beams and to convert the one or more laser light beams to electrical power, wherein the resonant cavity photovoltaic device has a first resonant operating frequency or wavelength that is similar to or matches the first laser wavelength or frequency;
   a current sensor, the current sensor configured to measure current in a resonant cavity photovoltaic cell of the resonant cavity photovoltaic device, the current measurement utilized to identify a deviation of the first resonant operating wavelength or frequency of the resonant cavity photovoltaic device with respect to the first laser wavelength or frequency of the laser device;
   a first wireless communication transceiver, the first wireless communication transceiver configured to communicate the current measurement to the laser device;
   a second wireless communication transceiver, the second wireless communication transceiver configured to receive the current measurement and communicate the current measurement; and
   one or more first microcontrollers coupled to the second wireless communication transceiver, sensors, and the laser device, the one or more first microcontrollers configured to receive the current measurement from the current sensor and to communicate signals to the laser device in order to adjust or tune the first laser wavelength or frequency in order to generate an adjusted current to increase a generated electrical power of the resonant cavity photovoltaic device.

2. The system of claim 1, wherein the resonant cavity photovoltaic device includes a photovoltaic diode sandwiched between a pair of mirrors, or a p-n junction optical waveguide ring resonator, to enhance light from the one or more laser beams received at the resonant cavity photovoltaic device and to capture incident light to increase efficiency of light absorption from the one or more laser beams.

3. The system of claim 2, wherein the pair of mirrors are distributed Bragg mirrors.

4. The system of claim 1, further including:
   a temperature control device, the temperature control device to include:
   one or more temperature sensors, the one or more temperature sensors configured to monitor and capture a temperature of the resonant cavity photovoltaic device; and
   one or more thermoelectric cooler (TEC) elements or resistive heater elements, the one or more TEC elements or resistive heater elements configured to control the temperature of the resonant cavity photovoltaic device,
   wherein if the captured temperature of the resonant cavity photovoltaic device deviates from an established temperature, the temperature control device is configured to cool or activate heating of the resonant cavity photovoltaic device to match the established temperature.

5. A system to deliver power via one or more laser beams, comprising:
   a laser device, the laser device configured to generate the one or more laser light beams, the one or more laser light beams to communicate power signals and optional data signals, the one or more laser light beams having a first laser wavelength or frequency;
   a resonant cavity photovoltaic device configured to receive the one or more laser light beams and to convert the one or more laser light beams to electrical power, wherein the resonant cavity photovoltaic device has a first resonant operating wavelength or frequency that is similar to or matches the first laser wavelength or frequency;
   a current sensor, the current sensor configured to measure current in the resonant cavity photovoltaic device, the measured current to identify a deviation of the resonant operating wavelength or frequency of the resonant cavity photovoltaic device with respect to the first laser wavelength or frequency of the laser device;
   a thermoelectric device or resistive heater elements coupled to the current sensor; and
   one or more first microcontrollers, the one or more first microcontrollers configured to receive the measured current from the current sensor and to communicate signals to the resistive heater elements or the thermoelectric device to heat or cool the resonant cavity photovoltaic device if the measured current is below a current threshold value in order to increase generated current from the resonant cavity photovoltaic device.

6. The system of claim 1, further comprising:
   a temperature control device including one or more temperature sensors, the one or more temperature sensors configured to monitor and measure a temperature of the resonant cavity photovoltaic device and to transfer the measured temperature;
   one or more second microcontrollers, the one or more second microcontrollers coupled to the one or more temperature sensors and the first wireless communication transceiver, and the one or more second microcontrollers configured to receive the measured temperature from the one or more temperature sensors and if the measured temperature of the resonant cavity photovoltaic device deviates from a threshold temperature, to generate and communicate a control signal to the first wireless communication transceiver.

7. The system of claim 6, further comprising:
   the second wireless communication transceiver to receive the control signal from the first wireless communication transceiver;
   a laser driver device;
   the one or more first microcontrollers to receive the control signal from the second wireless communication transceiver; and
   one or more memory devices, the one or more memory devices storing computer-readable instructions, the computer-readable instructions executable by the one or more first microcontrollers to communicate with the laser driver device to change the first laser wavelength or frequency based on a difference between the measured temperature and the threshold temperature.

8. The system of claim 7, wherein the first wireless communication transceiver communicates with the second wireless communication transceiver utilizing a wireless communication protocol.

9. The system of claim 1, further comprising:
an interferometer configured to monitor and measure a frequency drift of the resonant cavity photovoltaic device and to transfer the frequency drift measurement;
one or more second microcontrollers, the one or more second microcontrollers coupled to the interferometer and configured to receive the frequency drift measurement from the interferometer and if the frequency drift measurement of the resonant cavity photovoltaic device deviates from a threshold frequency drift measurement, to generate and communicate a control signal to the first wireless communication transceiver.

10. The system of claim 9, further comprising:
the second wireless communication transceiver configured to receive the control signal from the first wireless communication transceiver;
a laser driver device;
the one or more first microcontrollers configured to receive the control signal from the second wireless communication transceiver; and
one or more memory devices, the one or more memory devices storing computer-readable instructions, the computer-readable instructions executable by the one or more first microcontrollers to communicate with the laser driver device to change a first laser wavelength or frequency of the laser device based on the frequency drift measurement in the resonant cavity photovoltaic device.

11. The system of claim 1, further comprising:
a laser driver device to control operation of the laser device;
one or more temperature sensors, the one or more temperature sensors configured to measure an operating temperature of the laser device and communicate the measured operating temperature;
one or more memory devices;
the one or more first microcontrollers configured to receive the measured operating temperature of the laser device;
a temperature controller;
a thermoelectric device; and
computer-readable instructions, the computer-readable instructions stored in the one or more memory devices and executable by the one or more first microcontrollers to receive the measured operating temperature of the laser device and if the measured operating temperature is outside an established temperature range, the one or more first microcontrollers configured to communicate a control signal to the temperature controller;
the temperature controller configured to receive the control signal and to transmit a temperature control signal to the thermoelectric device, the thermoelectric device configured to cool or heat the laser device.

12. The system of claim 1, further comprising:
a laser power monitor device configured to monitor or measure power of the laser device and transfer a power measurement;

a laser driver configured to control operation of the laser device;
one or more memory devices;
computer-readable instructions stored in the one or more memory devices and executable by the one or more first microcontrollers to receive the power measurement and to communicate a control signal to the laser driver to change a parameter of the laser device based at least in part on the power measurement.

13. The system of claim 1, further comprising:
a rechargeable battery;
a first wireless communication transceiver; and
a battery charger, the battery charger configured to receive current from the resonant cavity photovoltaic device and to provide power to the rechargeable battery, the first wireless communication transceiver; and the one or more first microcontrollers,
the rechargeable battery configured to provide electrical power to a load.

14. The system of claim 13, further comprising:
a battery management system, the battery management system configured to measure current, voltage or power output from the rechargeable battery; and, if the current, voltage or power measurement is outside an acceptable range, the battery management system to communicate with the one or more first microcontrollers to communicate with one or more second microcontrollers communicatively coupled to the laser device to increase or decrease power output from the laser device.

15. A system to deliver power via one or more laser beams, comprising:
a laser device, the laser device configured to generate the one or more laser light beams, the one or more laser light beams to communicate power signals and optional data signals, the one or more laser light beams having a first laser wavelength or frequency; and
a resonant cavity photovoltaic device configured to receive the one or more laser light beams and to convert the one or more laser light beams to electrical power, wherein the resonant cavity photovoltaic device has a first resonant operating wavelength or frequency that is similar to or matches the first laser wavelength or frequency;
a rechargeable battery;
a first wireless communication transceiver;
one or more first microcontrollers;
a battery charger, the battery charger configured to receive current from the resonant cavity photovoltaic device and to provide power to the rechargeable battery, the first wireless communication transceiver; and the one or more first microcontrollers, wherein the rechargeable battery configured to provide electrical power to a load;
a voltage regulator, the voltage regulator coupled to the resonant cavity photovoltaic device, to receive current and voltage from the resonant cavity photovoltaic device and to provide power to the load;
a current sensor, the current sensor coupled to the voltage regulator, the current sensor to generate a current measurement; and
a battery management system, the battery management system configured to measure battery charge parameters from the rechargeable battery; and, if the battery charge parameters are outside an acceptable range, the battery management system to communicate with the one or more first microcontrollers, the one or more first microcontrollers configured to communicate with one or more second microcontrollers communicatively coupled to the laser device to increase or decrease power output from the laser device.

16. A system to deliver power via one or more laser beams, comprising:
- a laser device, the laser device configured to generate the one or more laser light beams, the one or more laser light beams to communicate power signals and optional data signals, the one or more laser light beams having a first laser wavelength or frequency; and
- a resonant cavity photovoltaic device configured to receive the one or more laser light beams and to convert the one or more laser light beams to electrical power, wherein the resonant cavity photovoltaic device has a first resonant operating wavelength or frequency that is similar to or matches the first laser wavelength or frequency;
- one or more current sensors, the one or more current sensors configured to measure current output by a voltage regulator and to transfer the measured current;
- a first wireless communication transceiver;
- one or more first microcontrollers, the one or more first microcontrollers coupled to the one or more current sensors and the first wireless communication transceiver, and configured to receive the measured current from the one or more current sensors and if the measured current of the resonant cavity photovoltaic device deviates from an established current range, to generate and communicate a control signal to the first wireless communication transceiver;
- the first wireless communication transceiver to receive the control signal and communicate the control signal;
- a second wireless communication transceiver to receive the control signal from the first wireless communication transceiver and to communicate the control signal;
- a laser driver device;
- one or more second microcontrollers; and
- one or more memory devices, the one or more memory devices storing computer-readable instructions, the computer-readable instructions executable by the one or more second microcontrollers to receive the control signal and to communicate with the laser driver device to change an output power of the laser device based at least in part on the control signal received from the first wireless communication transceiver.

17. The system of claim 1, further comprising:
- a first router device coupled to the first wireless communication transceiver and the second wireless communication transceiver, wherein the first wireless communication transceiver and the second wireless communication transceiver are configured to communicate with the first router device.

18. The system of claim 1, wherein the resonant cavity photovoltaic device is formed on a thin film.

19. The system of claim 1, further comprising additional resonant cavity photovoltaic devices configured to receive the one or more laser light beams and to convert the one or more laser light beams to electrical power, wherein the additional resonant cavity photovoltaic devices have a first resonant operating frequency or wavelength that is similar to or matches the first laser frequency or wavelength and where the resonant cavity photovoltaic device and the additional resonant cavity photovoltaic devices form an array subsystem of photovoltaic devices with the resonant cavity photovoltaic device to generate a larger amount of electrical power.

\* \* \* \* \*